US006983074B1

(12) United States Patent
Clauson et al.

(10) Patent No.: US 6,983,074 B1
(45) Date of Patent: Jan. 3, 2006

(54) DATA COMPRESSION SYSTEM AND TECHNIQUE

(75) Inventors: Jon D. Clauson, Maple Grove, MN (US); Christopher P. Hondl, Minneapolis, MN (US)

(73) Assignee: Adobe Systems Incorporated, San Jose, CA (US)

( * ) Notice: Subject to any disclaimer, the term of this patent is extended or adjusted under 35 U.S.C. 154(b) by 701 days.

(21) Appl. No.: 09/880,085

(22) Filed: Jun. 14, 2001

Related U.S. Application Data

(60) Provisional application No. 60/211,493, filed on Jun. 14, 2000.

(51) Int. Cl.
*G06K 9/36* (2006.01)

(52) U.S. Cl. ........................................ 382/244; 382/166

(58) Field of Classification Search ................. 382/166, 382/244–246, 253, 162–167, 239, 243; 358/3.05, 358/504, 539, 578, 119; 345/589, 597, 600–611, 345/569; 341/95, 50–51, 106–107, 60, 65, 341/87, 67; 348/409.1, 421
See application file for complete search history.

(56) References Cited

U.S. PATENT DOCUMENTS 4,558,302 A 12/1985 Welch
5,181,014 A * 1/1993 Dalrymple et al. ......... 345/569
5,740,345 A * 4/1998 Danielson et al. .......... 345/593
5,751,450 A * 5/1998 Robinson .................... 358/504
5,990,864 A * 11/1999 DeAguiar et al. .......... 345/600
6,522,783 B1 * 2/2003 Zeng et al. ................. 382/239

OTHER PUBLICATIONS

Chiang et al., Adaptive lossy LZW algorithm for palletised image compression, IEEE vol. 33, Issue 10, ISSN: 0013–5194, 852–854.*
Ausbeck, Context models for pallete image, IEEE Inspec Accession No.: 6010841, 1–10.*
S.W. Chiang et al.; "Adaptive Lossy LZW Algorithm For Palettized Image Compression"; *IEE Electronics Letters*, vol. 33, No. 10; pp. 852–854; May 8, 1997.
Cornel Constantinescu et al.; "Improved Techniques for Single–Pass Adaptive Vector Quantization"; *Proceedings of The IEEE*, vol. 82, No. 6; pp. 933–939; Jun. 1994.
Mikhail Atallah et al.; "Pattern Matching Image Compression: Algorithmic and Empirical Results"; *IEEE Transactions on Pattern Analysis and Machine Intelligence*; vol. 21, No. 7, pp. 614–627; Jul. 1999.

(Continued)

*Primary Examiner*—Leo Boudreau
*Assistant Examiner*—Ishrat Sherali
(74) *Attorney, Agent, or Firm*—Fish & Richardson P.C.

(57) ABSTRACT

Methods and apparatus, including computer program products, are used to compress a true color image in such a way that the compressed image may be decompressed by a decompression method according to a dictionary-based compression technique. A color table defines a mapping from true colors to index color values. A set of zero or more candidate strings for a current pixel in the image is identified in a compression dictionary. Each candidate string corresponds to a string of pixels in the image, with the last pixel of the string corresponding to the current pixel. Each candidate string approximately matches the corresponding image pixel string. If the set of candidate strings for the current pixel is empty, one of the candidate strings for the previous current pixel is selected, and a code for the selected string is added to a compressed representation of the image.

60 Claims, 6 Drawing Sheets

OTHER PUBLICATIONS

Dennis Araaud et al.; "Pattern Matching Image Compression With Predication Loop: Preliminary Experimental Results" *Technical Report CSD—TR—96—069*; Department of Computer Sciences, Purdue University; pp. 1–14; Nov. 11, 1996.

Steven Pigeon; "An Optimizing Lossy Generalization of LZW"; *Proceedings DCC 2001, Data Compression Conference*; p. 509; presented Mar., 2001.

Tomasz Luczak et al.; "A Suboptimal Lossy Data Compression Based on Approximate Pattern Matching"; *IEEE Trans. Inf. Theory*; vol. 43; No. 5; pp. 1439–1451; Sep. 1997.

Steven Pigeon; "An Optimizing Lossy Generalization of LZW"; Preprint accessible at http://www.iro.umontreal.ca/~pigeon/ before Jun. 14, 2001; pp. 1–8.

Tomasz Luczak et al.; "A suboptimal Lossy Data Compression Based on Approximate Pattern Matching"; Preprint accessible on Aug. 5, 1996; pp. 1–28.

C. Wayne Brown et al.; "Graphics File Formats: Reference and Guide"; "Data Compression—The Basics"; pp. 184–190; Copyright 1995.

* cited by examiner

200

202 204

| Color-Lookup Table | |
|---|---|
| Index (i) | True Color |
| 0 | $(X_0, Y_0, Z_0)$ |
| 1 | $(X_1, Y_1, Z_1)$ |
| 2 | $(X_2, Y_2, Z_2)$ |
| . . . | . . . |
| N | $(X_N, Y_N, Z_N)$ |

| Compression Dictionary | |
|---|---|
| Code (j) | String |
| 0 | $[(X_0, Y_0, Z_0)] = 0$ |
| 1 | $[(X_1, Y_1, Z_1)] = 1$ |
| 2 | $[(X_2, Y_2, Z_2)] = 2$ |
| ⋮ | ⋮ |
| N | $[(X_N, Y_N, Z_N)] = N$ |
| N+1 | $[(TC_1), (TC_2), ...] = N+1$ |
| N+2 | $[(TC_1), (TC_2), ...] = N+2$ |
| ⋮ | ⋮ |
| N + M | $[(TC_1), (TC_2), ...] = N + M$ |

302 — Code (j) column
304 — String column
200

$TC_K$ is an element of the set of True color codes in the color-lookup table 200

400

| Sample Compression Dictionary | |
|---|---|
| Code | String |
| 0 | [(0, 0, 0)] = 0 |
| 1 | [(5, 0, 0)] = 1 |
| 2 | [(10, 0, 0)] = 2 |
| . . . | . . . |
| 72 | [(250, 75, 75)] = 72 |
| . . . | . . . |
| 213 | [(64, 267, 84)] = 213 |
| . . . | . . . |
| N | [(255, 255, 255)] = 255 |
| . . . | . . . |
| 456 | [72, 213] |
| . . . | . . . |
| N+M | [6, 7, 192, 151] |

FIG. 4

*Kernel in which the error value of a pixel is used to adjust a true color of those pixels adjacent and following in sequence that pixel

DATA COMPRESSION SYSTEM AND TECHNIQUE

CROSS REFERENCE TO RELATED APPLICATIONS

This application claims benefit of U.S. Provisional Application No. 60/211,493, filed Jun. 14, 2000, which is incorporated herein by reference.

BACKGROUND

This invention relates to compression of data.

In dictionary-based compression techniques, a codebook or dictionary is generated during compression—the codebook assigns a unique code to a sequence of uncompressed data. Generally, the codebook must be stored along with the compressed data; otherwise a decompressor would have no way of knowing what the codes represent. In contrast, in LZW (Lempel-Ziv-Welsh) compression, the compressor and decompressor build identical codebooks as data is processed sequentially, thus avoiding the need to store or transmit a codebook. The compressor outputs a pattern code only after it has found the pattern more than once. The first time the compressor processes a sequence of data, it places that sequence in its codebook and outputs the sequence without any encoding. The decompressor will receive this sequence and place it in its codebook. The compressor, when it sees a pattern repeated for a second time, outputs the code from its codebook for the pattern. The decompressor can recognize the code because it has built an identical codebook from the previous sequences of data.

The LZW compression technique works well on a variety of data. The Unix compress utility and the personal computer ARC utility are based on LZW compression. Additionally, the Graphical Interchange Format (GIF), which is a popular palettized image compression format used in the World Wide Web (WWW), uses the LZW algorithm.

SUMMARY

An image is defined by pixels, where each pixel has a true color. The image is compressed such that the compressed image may be decompressed by a decompression method according to a color table-based compression technique. The image and a color table are received. The color table defines a mapping from true colors to index color values. A set of zero or more candidate strings for a current pixel in the image is identified in a compression dictionary. Each candidate string corresponds to a string of pixels in the image, with the last pixel of the string corresponding to the current pixel. Each candidate string approximately matches the corresponding image pixel string. If the set of candidate strings for the current pixel is empty, one of the candidate strings for the previous current pixel is selected, and a code for the selected string is added to a compressed representation of the image.

Implementations may include one or more of the following features. The compressed representation may be embedded in a GIF file.

Two strings may be an approximate match if, at each string position, the true color from one of the strings approximately matches the true color from the other of the strings. Two colors may be approximate matches if a distance between them is less than a threshold. The distance between two colors may be measured using a standard Euclidean distance metric. The distance between two colors may be measured using a weighted Euclidean distance metric. The threshold may vary across the image.

Two strings may be approximate matches if an aggregate distance between the two strings is less than a threshold value.

The selected dictionary-based compression technique may implement an LZW algorithm. The candidate string that is selected may be a string whose selection causes a minimum increase in the size of an LZW dictionary.

An error amount may also be calculated. The error amount is calculated as the amount between the true color of the candidate string pixel corresponding to the current pixel and the true color of the current pixel. The error amount may be distributed to modify pixels in the image before processing them for compression. The error amount may be distributed according to an error diffusion technique. The error diffusion technique may be a Floyd-Steinberg technique.

Implementations of the invention may include one or more of the following advantageous features. For example, the compressed representation output from the compression process may be decompressed using standard LZW decompression, which is a very popular technique used in the WWW for GIF.

The details of one or more embodiments are set forth in the accompanying drawings and the description below. Other features, objects, and advantages will be apparent from the description, the drawings, and the claims.

DESCRIPTION OF DRAWINGS

FIG. 2 illustrates a color table used in the process of FIG. 1.

FIG. 4 illustrates a sample compression dictionary used in the process of FIG. 1.

Like reference symbols in the various drawings indicate like elements.

DETAILED DESCRIPTION

Figure 1A:
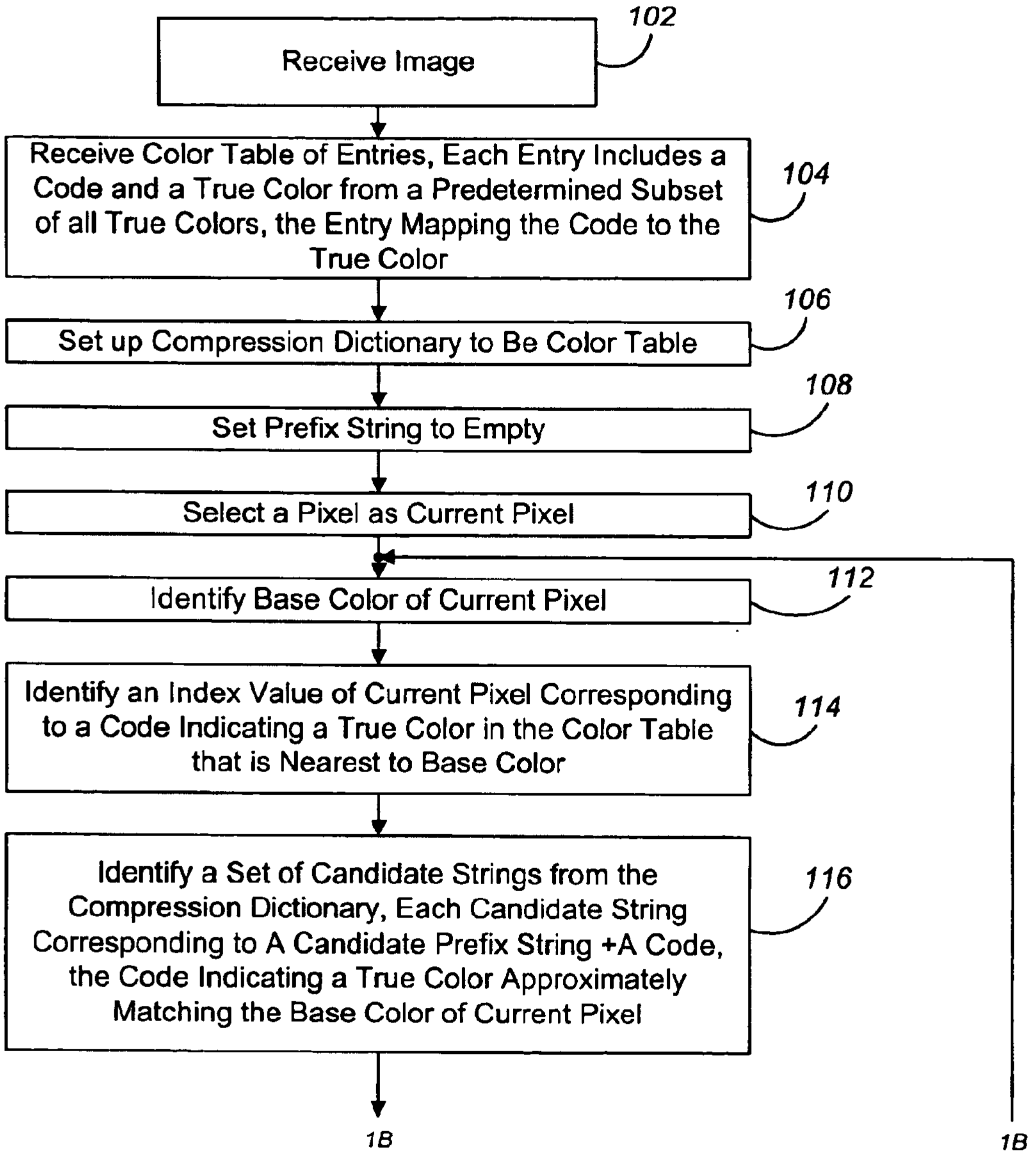
FIG. 1 is a flow chart of a process for compressing an image using a dictionary-based technique in accordance with the invention.
Figures 1, 1B:
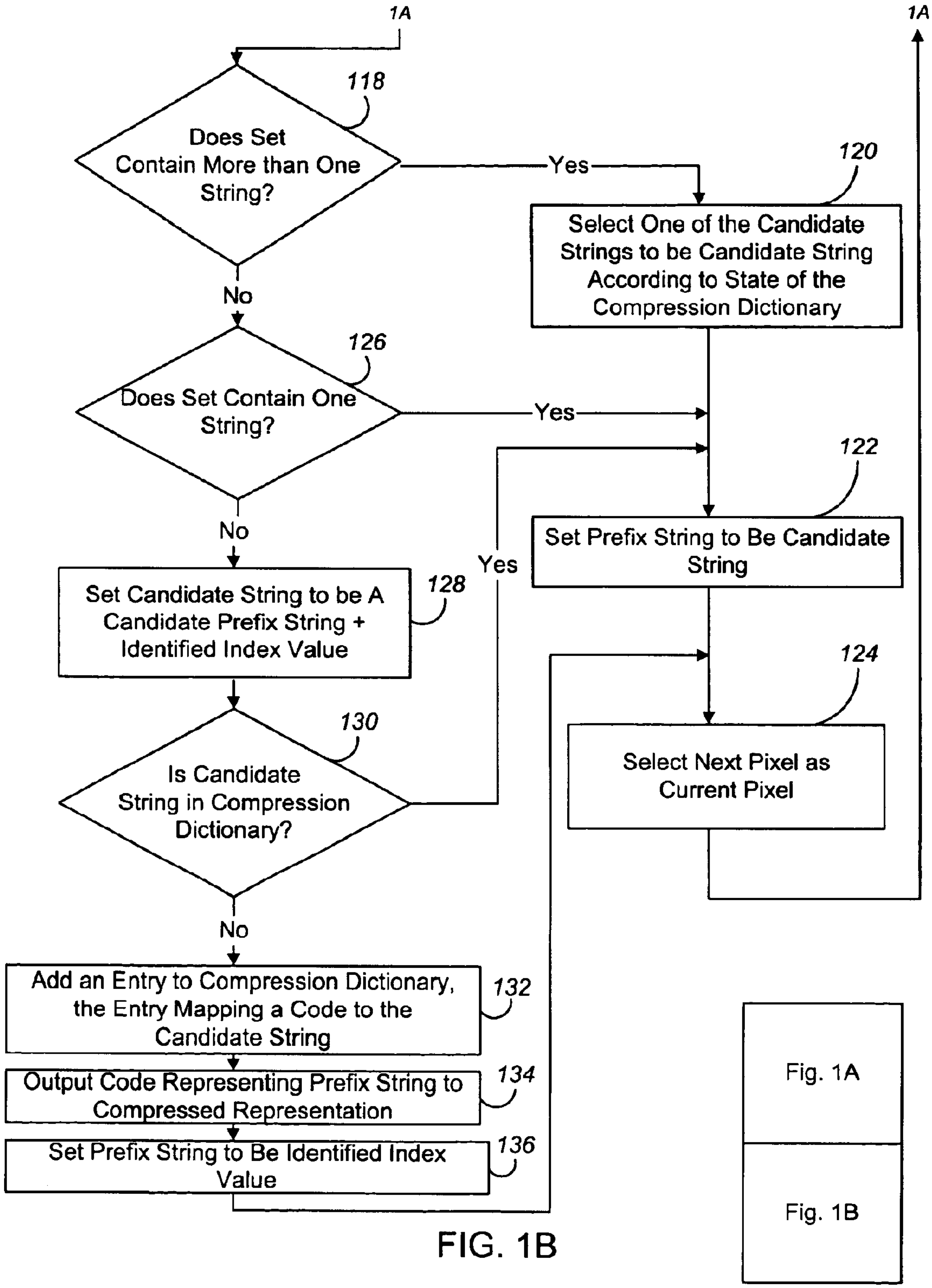

FIG. 1 shows a process 100 implemented in a computer program application for compressing data from an image. The process operates so as to generate a compressed representation that can be decompressed by a method according to a color table-based compression technique such as LZW.

In general, the process 100 operates by examining a compression dictionary for strings that the LZW compression algorithm uses for compression and then identifying approximate matches between the strings in that compression dictionary and strings of true colors of the image pixels. Optionally, a color of a particular pixel is adjusted during the process to account for approximation errors of pixels nearby the particular pixel.

Initially into the process 100, a digital image is received (step 102). A digital image is a collection of digital information that may be cast into the form of a visual image. Digital images may include, for example, photographs, artwork, documents, and web pages. Digital images may be obtained, for example, from digital cameras, digital video, scanners, and facsimile. The images may be two-dimensional or multi-dimensional. For example, three-dimensional images may include representations of three-dimensional space, or of two-dimensional movies, where the third dimension is time.

The fundamental element of a digital image is a pixel. Generally, a pixel has a specific location in the digital image and it contains color information for that location. Color information is represented by a vector of values, the vector characterizing all or a portion of the image intensity information. Color information could, for example, be represented by red (R), green (G), and blue (B) intensities in an RGB color space. Or, color information may represent a single luminosity in a grayscale color space.

A color space is a multi-dimensional space in which each point in the space corresponds to a color. For example, RGB color space is a color space in which each point is a color formed of the additive amounts of red, green, and blue colors. As another example, color information could represent information such as cyan-magenta-yellow (CMY), cyan-magenta-yellow-black (CMYK), Pantone, Hexachrome, x-ray, infrared, and gamma ray intensities from various spectral wavelength bands. Thus, for example, in CMY color space, each point is a color formed of the combination of cyan, magenta, and yellow colors. Color information may, in addition, represent other modalities of information, such as acoustic amplitudes (sonar, ultrasound) or magnetic resonance imaging (MRI) amplitudes.

In RGB color space, levels of red, green, and blue can each range from 0 to 100 percent of full intensity. Each level can be represented by a range of decimal numbers from, for example, 0 to 255 (256 levels for each color) with an equivalent range of binary numbers extending from 00000000 to 11111111. The total number of available colors would therefore be 256×256×256, or 16,777,216 possible colors.

Because of the large number of available colors in color representations such as CMY, CMYK, LAB, XYZ, and RGB, and because of the varying degrees of resolution (for example, 12 bit or 16 bit depth), colors are often referred to as true colors. A true color is a direct representation of a color and is a point in the color space used to represent the color information of the image.

The process 100 operates by receiving a color table, also referred to as a color-lookup table (step 104). The color table generally defines a color palette that is used to represent an image as an indexed image. The color table is typically predefined, but may be built on the fly. Referring also to FIG. 2, the color table 200 includes entries, where each entry may be represented by index i 202 and a corresponding true color 204, which may be, for example, represented as a triplet for a three color space ($x_i$, $y_i$, $z_i$). In this case, each $x_i$, $y_i$, or $z_i$ represents a color level in the three-color space. Because the number of true colors is generally large (as mentioned above, there are 16,777,216 true colors in a 256-cubed RGB color space), the color table 200 typically has entries for a subset of all available true colors, where the subset has N+1 entries. N may be any value, but typical values are 255 (for 256 entries) or 4095 (for 4096 entries). In the web safe color palette, N is 215 (for 216 entries). For GIF formats, N ranges from 1 to 255. Other dictionary formats may allow for larger ranges of N.

Figure 3:
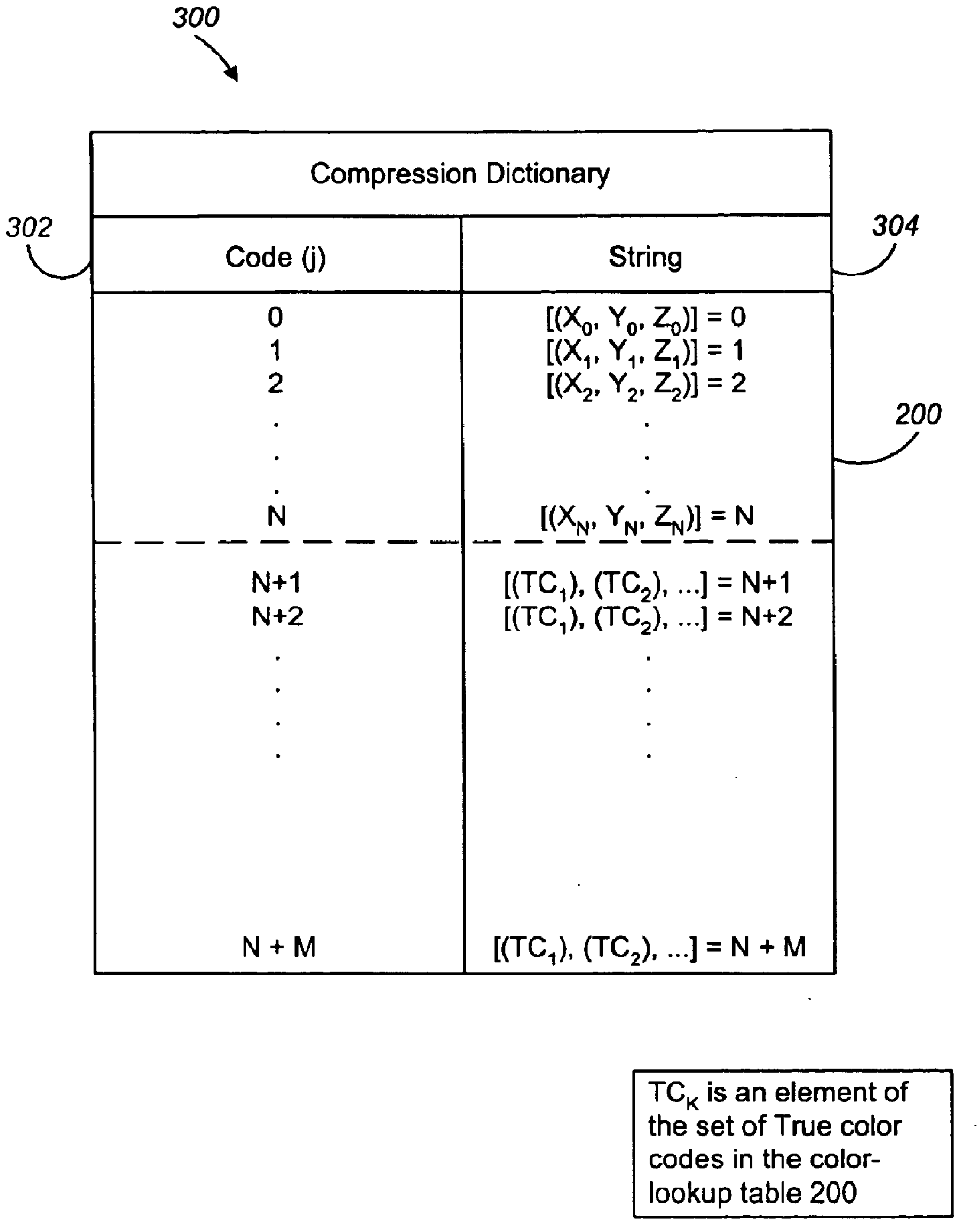
FIG. 3 illustrates a compression dictionary used in the process of FIG. 1.

After receiving the color table, a compression dictionary is initially set up (step 106). The compression dictionary may be set up to include the color table (as shown in FIG. 3) or the compression dictionary may be set up to be empty. Referring also to FIG. 3, the compression dictionary 300 includes entries, where each entry is represented by a code j 302 and a corresponding string of true color codes $[(TC_1), (TC_2), \ldots]_j$ 304, where $TC_k$ is a true color index selected from the subset N+1 of all available true colors represented in the color table.

Referring to the sample compression dictionary 400 in FIG. 4, a $TC_1$, index of 72 may be, for example, the triplet associated with pale red in RGB color space (250, 75, 75) and a $TC_2$ index of 213 may be, for example, the triplet associated with the color dark green (64, 267, 84). In the sample compression dictionary 400, the code 456 indicates the string [72, 213], which corresponds to the index for pale red followed by the index for dark green.

The number of entries in the compression dictionary 300 at any time during compression is N+M+1, where M is the total number of entries added during compression of the image up to that time. As discussed in greater detail below, the compression dictionary grows as new entries are added to compress the data.

The index 202 and codes 302 may be of variable length to further compress the data, as is well known in LZW compression. For example, the codes may start with the number of bits needed to represent the largest value plus 1 bit. If, while building the compression dictionary, a code added to the compression dictionary totally uses the current code length, then the code length may be increased by 1 bit. For example, if the initial compression dictionary is created to handle 256 entries (thus, the color table has 256 entries), then the code lengths would start with 9 bits. After the 511$^{th}$ entry into the compression dictionary, the code lengths would automatically increment to 10 bits, and so on.

Before compression, a prefix string [prefix] is set to empty (step 108). The prefix string may be a sequential ordered list of indices from the color table. When referring to a string of data values present in the compression dictionary, that string of data values may be represented as [prefix] [data value], indicating a concatenation of a prefix string with the data value string.

Next, a first pixel from the image is selected as the current pixel to consider (step 110). Although any pixel may be initially selected, it is conventional, when using GIF format, to select that pixel at an upper, left hand corner of the image, and to advance sequentially from left to right and top to bottom during the process 100.

The process 100 operates by identifying a base color of the current pixel (step 112). The base color may be identified using an error diffusion technique. In this technique, the base color is dependent on the true color of the current pixel and a dither value of the current pixel, the dither value being a function of error values in the neighboring pixels. An error value of a pixel is a representation of how well a true color of that pixel matches a true color from the color table. Therefore, the dither value takes into account a total error in the color approximations of neighboring pixels. In other words, an error value at a pixel is distributed among other pixels in the image. One example of an error diffusion technique is the Floyd Steinberg algorithm.

Figure 5:
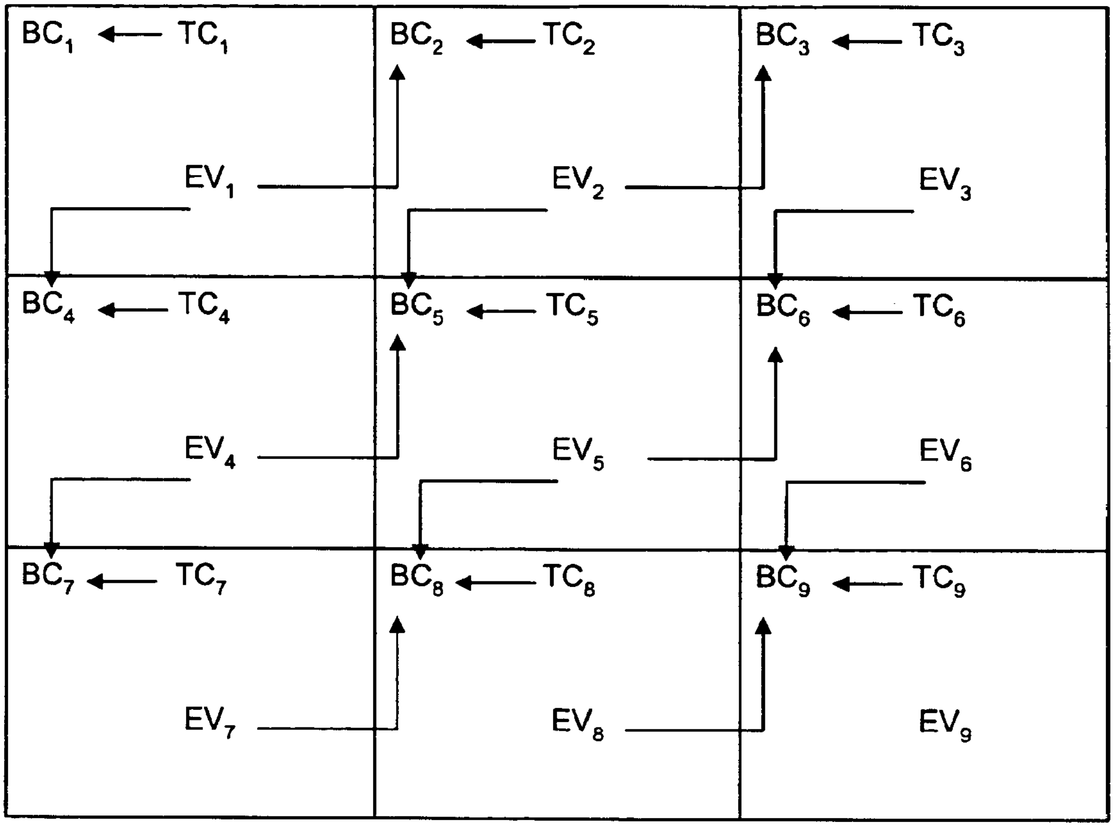
FIG. 5 is a diagram of a 3-pixel×3-pixel image demonstrating base color estimations of the pixels.

Referring to a 3-pixel×3-pixel image 500 in FIG. 5, each pixel is represented by a square with a true color (TC), a base color (BC), and an error value. In FIG. 5, the kernel used for dithering includes only those pixels neighboring a particular pixel that are directly beside or above, and sequentially before the particular pixel. In general, the kernel used for dithering may be more complicated. For example, the kernel may include pixels neighboring a particular pixel that are diagonal from the particular pixel, or those pixels within a predetermined distance from the particular pixel.

In FIG. 5, arrows from one value to another represent dependency between those values. Each pixel's base color is dependent on that pixel's true color plus a fraction of the error values of neighboring pixels. Thus, the base color of pixel 5 depends on the its own true color and the percentages of each of the error values of pixels 2 and 4. In one error diffusion technique, the error value (EV) of a neighboring pixel is computed to be a percentage of the difference between the true color (TC) of that neighboring pixel input at step 102 and the true color approximately matching the base color of that neighboring pixel determined at a later step in the process 100.

Next, the process 100 identifies an index value of the current pixel (step 114). The index value of the current pixel is an index selected from the color table that corresponds to a true color that is nearest in color space to the base color of the current pixel. Any distance metric, such as a standard Euclidean metric or a weighted Euclidean metric, may be used to measure the distance between the true color in the color table and the base color of the current pixel.

Next, a set of candidate strings is identified from the compression dictionary (step 116). Each candidate string is written as [candidate prefix][$TC_C$], where the index [$TC_C$] indicates a true color approximately matching the base color of the current pixel and [candidate prefix] is a prefix string. Identification of the set of candidate strings begins with a temporary string that may be written as the prefix string [prefix] followed by (or concatenated with) the base color (base color) of the current pixel: [prefix](base color).

There are several ways of identifying the set of candidate strings from the compression dictionary and the temporary string, [prefix](base color). In one way, a candidate string is any string in the compression dictionary that has a candidate prefix string [candidate prefix] followed by the true color index [$TC_C$], in which the candidate prefix string [candidate prefix] exactly matches the prefix string [prefix] in the temporary string, and in which the true color corresponding to the true color index [$TC_C$] approximately matches the base color (base color) of the current pixel. The true color may approximately match a base color if the true color is within a color space threshold $\tau_{cs}$ of the base color.

As discussed above, a prefix string may be a sequential ordered list of indices from the color table. Alternatively, the prefix string may be any sequential ordered list of codes from the compression dictionary. Thus, to have an exact match between the candidate prefix string and the prefix string, the two prefix strings must be of the same length and each code or index at a position in the candidate prefix string must correspond to the code or index at that same position in the prefix string. For example, the candidate prefix string [candidate prefix]=[34, 22, 56] exactly matches the prefix string [prefix]=[34, 22, 56]. In contrast, the candidate prefix string [candidate prefix]=[34, 22, 56] does not exactly match the prefix strings [prefix]=[35, 22, 56] or [34, 22].

The color space threshold $\tau_{cs}$ may be set before operation of the compression process 100. In another implementation, the predetermined color space threshold $\tau_{cs}$ may be preset before the current pixel's set of candidate strings is identified at step 116 to take into account neighboring pixel's candidate strings or to take into account the current pixel's index value. For example, if it is determined at step 114 that the true color nearest to the base color lies outside of the threshold $\tau_{cs}$, then the threshold $\tau_{cs}$ may increased to provide for at least one candidate string at step 116.

In another way of identifying the set of candidate strings from the compression dictionary and the temporary string, a candidate string is any string in the compression dictionary that has a candidate prefix string [candidate prefix] followed by a true color code [$TC_c$], in which the candidate prefix string [candidate prefix] approximately matches the prefix string [prefix] in the temporary string, and in which the true color corresponding to the true color code [$TC_C$] approximately matches the base color (base color) of the current pixel.

As above, the true color may approximately match a base color if the true color is within a predetermined color space threshold $\tau_{cs}$ of the base color. However, in this identification alternative, the candidate prefix string [candidate prefix] may be selected to approximately match the prefix string [prefix] in the temporary string. Using the example above, the candidate prefix string [candidate prefix]=[34, 22, 56] approximately matches the prefix strings [prefix]=[35, 22, 56] or [34, 25, 55]. The process 100 may operate by determining whether each of the codes in the candidate prefix string [candidate prefix] lies within a threshold of each of the codes at the same position in the prefix string [prefix].

In another way of identifying the set of candidate strings, an aggregate difference (that may be normalized by length) between the temporary string and the candidate string may be tested.

If the set of candidate strings contains more than one string (step 118), then one of the candidate strings is selected (step 120). The one candidate string may be selected at step 120 according to the state of the compression dictionary. In particular, the candidate string is selected to be that string whose selection would cause a minimum increase in the size of the compression dictionary. The one candidate string may be selected at step 120 by examining all possibilities, performing a tree search through the possible strings, and picking a path that is longest, thus causing a minimum increase in the size of the compression dictionary.

Once the candidate string is selected (step 120), the prefix string is set to be the candidate string (step 122). In this way, a new string will be built from previously known data strings plus one new data value after the next pixel is selected as the current pixel (step 124), and the process returns to identifying a base color of the current pixel (step 112).

If the set of candidate strings does not contain more than one candidate string (step 118), and if the set of candidate strings contains a single candidate string (step 126), then the prefix string is set to be the candidate string (step 122), and the next pixel is selected as the current pixel (step 124).

If the set of candidate strings does not contain a single candidate string (step 126), then the process next considers as the candidate string a candidate prefix string plus the identified index value from step 114 (step 128). If the candidate string is in the compression dictionary (step 130), then the prefix sting is set to be the candidate string (step 122) and the next pixel is selected as the current pixel (step 124).

If the candidate string is not in the compression dictionary (step 130), this indicates that a new pattern has been identified. Thus, an entry is added to the compression dictionary (step 132). That newly-assigned entry maps a new code to the candidate string. In this way, when the process sees that candidate string in the future, the process outputs its code.

Next, the code representing the prefix string is output to the compressed representation (step 134). As mentioned above, if, for the previous pixel, a candidate string was identified, then the prefix string is set to be the candidate string, and the code for the candidate string (assigned in step 132) is output to the compressed representation at step 134. Next, the prefix string is set to be the identified index value from step 114 (step 136). Thus, if, for the previous pixel, a candidate string was not identified, then the prefix string was set to be the identified index value (step 114), and the code indicating the true color from the color table that is nearest to the base color of the previous pixel is output to the compressed representation at step 134.

In any case, after the prefix string is set (step 136 or 122), the process selects the next pixel in the image as the current pixel (step 124).

The dithering process permits an improvement in image quality that may be reproduced during decompression. Moreover, the dithering process permits the use of a higher predetermined color space threshold $\tau_{cs}$.

The compressed representation output from the process 100 may be decompressed using a decompression method corresponding to the process 100. For example, the compressed representation output from the process 100 may be decompressed using standard LZW decompression if the compressed form was created by the particular implementation just described.

The techniques, methods, and systems described here may find applicability in any computing or processing environment in which electronic data may be compressed. Various implementations of the systems and techniques described here may be realized in digital electronic circuitry, or in computer hardware, firmware, software, or in combinations thereof. A system or other apparatus that uses one or more of the techniques and methods described here may be implemented as a computer-readable storage medium, configured with a computer program, where the storage medium so configured causes a computer system to operate on input and/or generate output in a specific and predefined manner. Such a computer system may include one or more programmable processors that receive data and instructions from, and transmit data and instructions to, a data storage system, and suitable input and output devices. Each computer program may be implemented in a high-level procedural or object-oriented programming language, or in assembly or machine language if desired; and in any case, the language may be a compiled or interpreted language. Suitable processors include, by way of example, both general and special purpose microprocessors.

Generally, a processor will receive in Actions and data from a read-only memory and/or a random access memory. Storage devices suitable for tangibly embodying computer instructions and data include all forms of non-volatile memory, including semiconductor memory devices, such as EPROM, EEPROM, and flash memory devices; magnetic disks such as internal hard disks and removable disks; magneto-optical disks; and CD-ROM disks.

These elements also can be found in a conventional desktop or workstation computer as well as other computers suitable for executing computer programs implementing the methods described here, which can be used in conjunction with any compression software, or any other software capable of compressing data. Any of the foregoing may be supplemented by, or implemented in, specially designed ASICs (application specific integrated circuits). The systems and techniques may be implemented as a standalone utility or plugin utility. Likewise, the systems and techniques may be implemented at the operating system level or as a feature of an application.

A number of embodiments have been described. Nevertheless, it will be understood that various modifications may be made without departing from the spirit and scope of the invention. For example, advantageous results still could be achieved if steps of the disclosed techniques were performed in a different order and/or if components in the disclosed systems were combined in a different manner and/or replaced or supplemented by other components. Accordingly, other embodiments are within the scope of the following claims.

For example, the base color of the selected pixel may be the true color of the selected pixel. In this case, there is no dithering of the data. The one candidate string may be selected at step 120 by selecting the candidate string for which the true color best matches the base color.

The color table may be adapted to the particular image being compressed.

The predetermined color space threshold $\tau_{cs}$ may be set dynamically as pixels are considered during the process 100. For example, the local noise level near a current pixel may alter the predetermined color space threshold $\tau_{cs}$. If the local noise level is high, then the predetermined color space threshold $\tau_{cs}$ may be increased.

The compressed data may be decompressed by a method according to any color table-based compression technique such as, for example, the deflate algorithm, which is commonly used in PNG formats. Basically, for any color table-based compression technique, the index values that are input into the technique are replaced by the true colors. Additionally, where the color table-based compression technique would normally compare an index value to elements in the compression dictionary to identify an exact match, the color table-based compression technique would now compare a true color (or base color) to elements in the compression dictionary to identify one or more candidates that approximately match the true color. Then, if there is more than one candidate, the technique is modified to select the candidate that produces the smallest compression dictionary. Moreover, the dithering technique detailed above with respect to the LZW compression technique may be applied to any color table-based compression technique.

What is claimed is:

1. A method for compressing an image, the method comprising:

receiving an image, the image being defined by pixels, each pixel having a true color, for decompression by a selected dictionary-based decompression technique;

receiving a color table that defines a mapping from true colors to index color values;

identifying a current pixel in the image, in which the current pixel is associated with exactly one previous current pixel;

identifying in a compression dictionary a set of zero or more candidate strings for the current pixel in the image, each candidate string corresponding to a string of pixels in a image, the last pixel of the string corresponding to the current pixel, and each candidate string approximately matching a corresponding image string; and if the set of candidate strings for the current pixel is empty, selecting one of the candidate strings for the previous current pixel, and adding a code for the selected string to a compressed representation of the image.

2. The method of claim 1, wherein the compressed representation is embedded in a GIF file.

3. The method of claim 1, wherein two strings are an approximate match, if at each string position the true color from one of the two strings approximately matches the true color from another of the two strings.

4. The method of claim 3, wherein two colors are approximate matches if a distance between them is less than a threshold.

5. The method of claim 4, wherein the distance between two colors is measured using a standard Euclidean distance metric.

6. The method of claim 4, wherein the distance between two colors is measured using a weighted Euclidean distance metric.

7. The method of claim 4, wherein the threshold varies across the image.

8. The method of claim 1, wherein two strings are approximate matches if an aggregate distance between the two strings is less than a threshold value.

9. The method of claim 1, wherein the selected dictionary-based compression technique implements an LZW algorithm.

10. The method of claim 9, wherein the candidate string that is selected is a string whose selection causes a minimum increase in a size of an LZW dictionary.

11. The method of claim 1, further comprising:

calculating an error amount between the true color of the candidate string pixel corresponding to the current pixel and the true color of the current pixel; and distributing the error amount to modify pixels in the image before processing them for compression.

12. The method of claim 11, wherein the error amount is distributed according to an error diffusion technique.

13. The method of claim 12, wherein the error diffusion technique is a Floyd-Steinberg technique.

14. A method of compressing an image defined by pixels, each pixel having a true color, for decompression by a selected dictionary-based decompression technique, the method comprising:

receiving the image;

identifying a current pixel in the image, in which the current pixel is associated with exactly one previous current pixel;

receiving a color table that defines a mapping from true colors to index color values;

identifying in a compression dictionary a set of zero or more candidate strings for a current pixel in the image, each candidate string corresponding to a concatenation of a candidate prefix string related to previous current pixels and an index color value related to the current pixel, in which the candidate prefix string exactly matches a prefix string in the compression dictionary and in which the index color value is an indication of true color in the color table that is an approximate match to a true color value of the current pixel in the image; and selecting one of the candidate strings for the previous current pixel if the set of candidate strings for the current pixel is empty, and adding a code for the selected string to a compressed representation of the image.

15. The method of claim 11, further comprising receiving a prefix string and setting the prefix string to the selected candidate string.

16. The method of claim 11, wherein if the set of candidate strings for the current pixel is empty then the added code maps to a string that includes a current prefix string plus a selected index color value that is selected from the index color value as corresponding to the true color value nearest to the true color of the pixel.

17. The method of claim 16, wherein the current prefix string is a selected index color value for a previous current pixel.

18. The method of claim 16, wherein the current prefix string is a selected candidate string for a previous current pixel.

19. A computer program product, tangibly stored on a machine-readable medium for compressing an image defined by pixels, each pixel having a true color, the compressed image able to be decompressed by a selected dictionary-based decompression technique, the product comprising instructions operable to cause a programmable processor to:

receive the image;

receive a color table that defines a mapping from true colors to index color values;

identify a current pixel in the image, in which the current pixel is associated with exactly one previous current pixel;

identify in a compression dictionary a set of zero or more candidate strings for the current pixel in the image, each candidate string corresponding to a string of pixels in the image, a last pixel of the string corresponding to the current pixel, and each candidate string approximately matching the corresponding image string;

if the set of candidate strings for the current pixel is empty, select one of the candidate strings for the previous current pixel, and add a code for the selected string to a compressed representation of the image.

20. The computer program product of claim 19, wherein the compressed representation is embedded in a GIF file.

21. The computer program product of claim 19, wherein two strings are an approximate match, if at each string position the true color from one of the two strings approximately matches the true color from another of the two strings.

22. The computer program product of claim 21, wherein two colors are approximate matches if a distance between them is less than a threshold.

23. The computer program product of claim 22, wherein the distance between two colors is measured using a standard Euclidean distance metric.

24. The computer program product of claim 22, wherein the distance between two colors is measured using a weighted Euclidean distance metric.

25. The computer program product of claim 22, wherein the threshold varies across the image.

26. The computer program product of claim 19, wherein two strings are approximate matches if an aggregate distance between the two strings is less than a threshold value.

27. The computer program product of claim 19, wherein the selected dictionary-based compression technique implements an LZW algorithm.

28. The computer program product of claim 27, wherein the candidate string that is selected is a string whose selection causes a minimum increase in the size of an LZW dictionary.

29. The computer program product of claim 19, further comprising instructions operable to cause a programmable processor to:

calculate an error amount between the true color of the candidate string pixel corresponding to the current pixel and the true color of the current pixel; and distribute the error amount to modify pixels in the image before processing them for compression.

30. The computer program product of claim 29, wherein the error amount is distributed according to an error diffusion technique.

31. The computer program product of claim 30, wherein the error diffusion technique is a Floyd-Steinberg technique.

32. A system comprising a computer-readable storage medium tangibly embodying program instructions for compressing an image defined by pixels, each pixel having a true color, the compressed image able to be decompressed by a selected dictionary-based decompression technique, the program instructions including instructions operable to cause a programmable processor to:

receive the image;

receive a color table that defines a mapping from true colors to index color values;

identify a current pixel in the image, in which the current pixel is associated with exactly one previous current pixel;

identify in a compression dictionary a set of zero or more candidate strings for the current pixel in the image, each candidate string corresponding to a string of pixels in the image, a last pixel of the string corresponding to the current pixel, and each candidate string approximately matching the corresponding image string;

if the set of candidate strings for the current pixel is empty, select one of the candidate strings for the previous current pixel, and add a code for the selected string to a compressed representation of the image.

33. The system of claim 32, wherein the compressed representation is embedded in a GIF file.

34. The system of claim 32, wherein two strings are an approximate match, if at each string position the true color from one of the strings approximately matches the true color from the other of the strings.

35. The system of claim 34, wherein two colors are approximate matches if a distance between them is less than a threshold.

36. The system of claim 35, wherein the distance between two colors is measured using a standard Euclidean distance metric.

37. The system of claim 35, wherein the distance between two colors is measured using a weighted Euclidean distance metric.

38. The system of claim 35, wherein the threshold varies across the image.

39. The system of claim 32, wherein two strings are approximate matches if an aggregate distance between the two strings is less than a threshold value.

40. The system of claim 32, wherein the selected dictionary-based compression technique implements an LZW algorithm.

41. The system of claim 40, wherein the candidate string that is selected is a string whose selection causes a minimum increase in the size of an LZW dictionary.

42. The system of claim 32, wherein the program instructions further include instructions operable to cause a programmable processor to:

calculate an error amount between the true color of the candidate string pixel corresponding to the current pixel and the true color of the current pixel; and distribute the error amount to modify pixels in the image before processing them for compression.

43. The system of claim 42, wherein the error amount is distributed according to an error diffusion technique.

44. The system of claim 43, wherein the error diffusion technique is a Floyd-Steinberg technique.

45. A method of compressing a raster image, for decompression using the LZW algorithm, the method comprising:

receiving the image represented as a raster of original true color values;

receiving a color table that defines a mapping from each true color in a palette of true colors to an index;

identifying a current pixel in the image, in which the current pixel is associated with exactly one previous current pixel;

identifying in a compression dictionary a set of zero or more candidate strings for the current pixel in the image, each candidate string corresponding to a string of pixels in the image and satisfying a string match condition with the corresponding string of pixels in the image, the string match condition being satisfied by an exact or an approximate matching of two strings according to the true color values of their pixels; and if the set of candidate strings for the current pixel is empty, selecting one of the candidate strings for the previous current pixel, and adding a code representing the selected candidate string to a compressed representation of the image.

46. A method of claim 45, wherein a last pixel of the string corresponds to the current pixel and has a true color that is one of the palette colors, the true color of the last pixel of the string satisfying a pixel match condition with a base color of the current pixel, the base color of the current pixel being a true color derived from the original true color of the current pixel, the pixel match condition being satisfied by an exact or an approximate matching of two true colors.

47. The method of claim 46, wherein the base color of the current pixel is the same as the original true color of the current pixel.

48. The method of claim 46, wherein the base color of the current pixel is the original true color of the current pixel plus or minus an error value.

49. The method of claim 45, wherein the pixels of the string are represented in the string by indices from the color table.

50. The method of claim 45, wherein the string match condition is satisfied if at each string position the true color from one of the two strings approximately matches the true color from another of the two strings.

51. The method of claim 45, wherein the string match condition is satisfied if an aggregate distance between the two strings is less than a threshold value.

52. The method of claim 45, wherein the candidate string that is selected is a string whose selection causes a minimum increase in the size of a compression dictionary.

53. A method of compressing a raster image, for decompression by a selected dictionary-based decompression technique, the method comprising:

receiving an image represented as a raster of original true color values;

receiving a color table that defines a mapping from each true color in a palette of true colors to an index;

identifying a current pixel in the image, in which the current pixel is associated with exactly one previous current pixel;

identifying in a compression dictionary a set of zero or more candidate strings for the current pixel in the image, each candidate string corresponding to a string of pixels in the image and satisfying a string match condition with the corresponding string of pixels in the image, the string match condition being satisfied by an exact or an approximate matching of two strings according to the true color values of their pixels;

if the set of candidate strings for the current pixel is empty, selecting one of the candidate strings for the previous current pixel, and adding a code representing the selected candidate string to a compressed representation of the image;

calculating an error amount between the true color of the candidate string pixel corresponding to the current pixel and the true color of the current pixel; and distributing the error amount to modify a base color of one or more pixels in the image, the base color of a pixel being a true color derived from the original true color of the pixel.

54. The method of claim 53, wherein the error value is distributed according to an error diffusion technique.

55. The method of claim 54, wherein the error diffusion technique is a Floyd-Steinberg technique.

56. A method of claim 53, wherein a last pixel of the string corresponds to the current pixel and has a true color that is one of the palette colors, the true color of the last pixel of the string satisfying a pixel match condition with the base color of the current pixel, the pixel match condition being satisfied by an exact or an approximate matching of two true colors.

57. The method of claim 56, wherein the base color of the current pixel is the same as the original true color of the current pixel.

58. The method of claim 56, wherein the base color of the current pixel is the original true color of the current pixel plus or minus an error value determined by one or more error amounts.

59. A computer program product, tangibly stored on a machine-readable medium for compressing a raster image, for decompression using the LZW algorithm, the product comprising instructions operable to cause a programmable processor to:

receive an image represented as a raster of original true color values;

receive a color table that defines a mapping from each true color in a palette of true colors to an index;

identify a current pixel in the image, in which the current pixel is associated with exactly one previous current pixel;

identify in a compression dictionary a set of zero or more candidate strings for the current pixel in the image, each candidate string corresponding to a string of pixels in the image and satisfying a string match condition with the corresponding string of pixels in the image, the string match condition being satisfied by an exact or an approximate matching of two strings according to the true color values of their pixels; and if the set of candidate strings for the current pixel is empty, select one of the candidate strings for the previous current pixel, and add a code representing the selected candidate string to a compressed representation of the image.

60. A computer program product, tangibly stored on a machine-readable medium for compressing a raster image, for decompression by a selected dictionary-based decompression technique, the product comprising instructions operable to cause a programmable processor to:

receive an image represented as a raster of original true color values;

receive a color table that defines a mapping from each true color in a palette of true colors to an index;

identify a current pixel in the image, in which the current pixel is associated with exactly one previous current pixel;

identify in a compression dictionary a set of zero or more candidate strings for the current pixel in the image, each candidate string corresponding to a string of pixels in the image and satisfying a string match condition with the corresponding string of pixels in the image, the string match condition being satisfied by an exact or an approximate matching of two strings according to the true color values of their pixels;

if the set of candidate strings for the current pixel is empty, select one of the candidate strings for the previous current pixel, and add a code representing the selected candidate string to a compressed representation of the image;

calculate an error amount between the true color of the candidate string pixel corresponding to the current pixel and the true color of the current pixel; and distribute the error amount to modify a base color of one or more pixels in the image, the base color of a pixel being a true color derived from the original true color of the pixel.

* * * * *

UNITED STATES PATENT AND TRADEMARK OFFICE

CERTIFICATE OF CORRECTION

PATENT NO. : 6,983,074 B1
APPLICATION NO. : 09/880085
DATED : January 3, 2006
INVENTOR(S) : Jon D. Clauson and Christopher P. Hondl It is certified that error appears in the above-identified patent and that said Letters Patent is hereby corrected as shown below:

Column 8, line 54, delete “a” and replace with --the--;
Column 9, line 51, before “true”, insert --the--;
Column 12, line 19, delete “A method” and insert --The method--;
Column 13, line 14, delete “A method” and insert --The method--.

Signed and Sealed this

Eighth Day of August, 2006

JON W. DUDAS
*Director of the United States Patent and Trademark Office*